United States Patent
Takaishi

Patent Number: 5,939,748
Date of Patent: Aug. 17, 1999

[54] STORAGE CAPACITOR HAVING A REFRACTORY METAL STORAGE ELECTRODE AND METHOD OF FORMING THE SAME

[75] Inventor: Yoshihiro Takaishi, Tokyo, Japan

[73] Assignee: NEC Corporation, Tokyo, Japan

[21] Appl. No.: 08/803,179

[22] Filed: Feb. 19, 1997

[30] Foreign Application Priority Data

Feb. 19, 1996 [JP] Japan ..................................... 8-030873

[51] Int. Cl.⁶ .................................................. H01L 47/00
[52] U.S. Cl. .......................... 257/310; 257/311; 257/532; 361/303
[58] Field of Search ................................... 257/310, 311, 257/532; 361/303, 321.1

[56] References Cited

U.S. PATENT DOCUMENTS

| | | | |
|---|---|---|---|
| 5,335,138 | 8/1994 | Sandhu et al. | 257/310 |
| 5,442,213 | 8/1995 | Okudaira et al. | 257/310 |
| 5,567,964 | 10/1996 | Kashihara et al. | 257/310 |
| 5,729,054 | 3/1998 | Summerfelt et al. | 257/751 |

Primary Examiner—Donald L. Monin, Jr.
Attorney, Agent, or Firm—Young & Thompson

[57] ABSTRACT

A method of forming a storage electrode on a silicon oxide layer is provided wherein a titanium nitride barrier metal layer is formed on an entire surface of the insulation layer. A tungsten storage electrode film is formed on an entire surface of the titanium nitride barrier metal layer. A titanium nitride etch back stopper film is formed on an entire surface of the storage electrode film. The etch back stopper film and the storage electrode film are selectively removed by a dry etching to define a storage electrode body, but leave the barrier metal layer over the entire surface of the silicon oxide layer. A tungsten side wall electrode film is entirely formed. The side wall electrode film is selectively removed by an etch back whereby the side wall electrode films remain only on the side walls of the storage electrode body. The etch back stopper film and the barrier metal layer are selectively removed whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer.

50 Claims, 3 Drawing Sheets

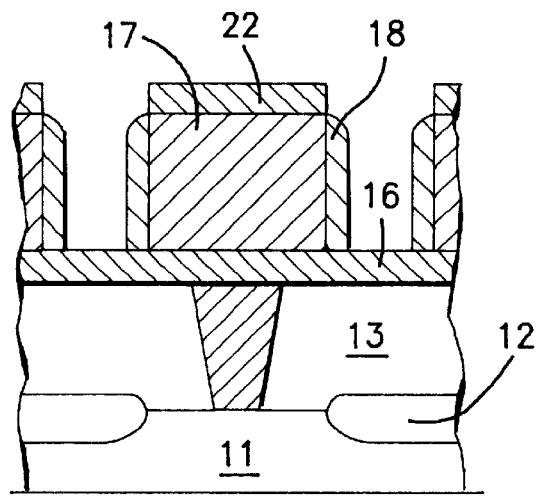
FIG. 5D
FIG. 5E
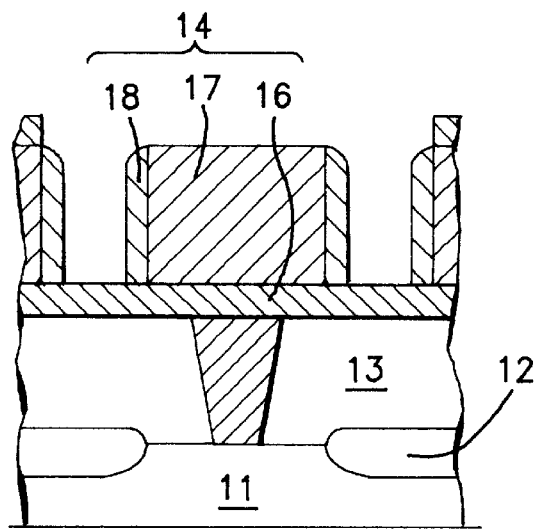
FIG. 5F

STORAGE CAPACITOR HAVING A
REFRACTORY METAL STORAGE
ELECTRODE AND METHOD OF FORMING
THE SAME

BACKGROUND OF THE INVENTION

The present invention relates to a storage capacitor in a semiconductor memory device and a method of forming the same, and more particularly to a storage capacitor having a refractory metal storage electrode for semiconductor memory devices such as dynamic random access memory device.

In recent years, improvement in high integration of the dynamic random access memory has been required, whilst this makes it difficult to secure a sufficiently large capacity of each memory cell in the dynamic random access memory due to the requirement for reduction in occupied area of each storage capacitor in the cell. In order to secure a sufficiently large capacity of the memory cell, it is effective to reduce the thickness of a capacitive insulation film of the storage capacitor and also to increase a surface area of interfaces of the storage electrode and the capacitive insulation film.

In order to reduce the thickness of the capacitive insulation film, it is effective to use a capacitive insulation film of an insulation material having a higher dielectric constant than that of a silicon nitride film.

One of the storage capacitor having a capacitive insulation film made of an insulation material having a high dielectric constant is disclosed in the Japanese laid-open patent publication No. 3-136361. This conventional storage capacitor will be described with reference to FIG. 1. A capacitive insulation film 1 is made of tantalum oxide $Ta_2O_5$ which has a high dielectric constant. A storage electrode 2 is made of tungsten because tungsten has a sufficient resistivity to oxidation which is carried out to form the capacitive insulation film 1. Namely, a tungsten storage electrode 2 is preferable to prevent the storage electrode 2 from oxidation when the capacitive insulation film 1 is formed. The prevention of the storage capacitor from oxidation results in prevention of the drop of the capacity of the storage capacitor. If the capacitive insulation film is made of an insulation material having a high dielectric constant in order to ensure a sufficiently high capacity of the storage capacitor, then any refractory metal such as tungsten is often used.

On the other hand, a method of increasing an area of an interface between the capacitive insulation film and the storage electrode is disclosed in the Japanese laid-open patent publication No. 3-69162. This method will be described with reference to FIG. 2. A storage electrode 4 is made of polysilicon. Further, polysilicon side walls 5 are formed at side walls of the ends of the polysilicon storage electrode. The polysilicon side walls serve as parts of the storage electrode in cooperation with the polysilicon storage electrode 4. The polysilicon side walls 5 substantially increase the area of the interface of the storage electrode and the capacitive insulation film. A distance between adjacent two storage electrodes is defined by a resolution limitation of an exposure system although the distance is preferred as small as possible. If the polysilicon side walls are provided at the side walls of the storage electrode, then the distance between the adjacent two storage electrodes is made small by the lateral size of the polysilicon side walls. This results in an increase in area of the interface between the polysilicon storage electrode united with the polysilicon side walls 5 and the capacitive insulation film. Actually, however, it is difficult to precisely form the polysilicon side walls 5 only on the side walls of the polysilicon storage electrode 4.

A method of easily forming polysilicon side walls on side walls of the polysilicon storage electrode 4 is disclosed in the Japanese laid-open patent publication No. 3-165552. This method will be described with reference to FIG. 3. Polysilicon storage electrodes 7 have been formed for subsequent formation of silicon oxide films 8 only on the polysilicon storage electrodes 7 before a polysilicon film is entirely deposited and then subjected to etch back process, wherein the silicon oxide film 8 serves as an etching stopper to the etch back. As a result of the etch back, the polysilicon film remain only on the side walls of the polysilicon storage electrodes 7 whereby polysilicon side walls 9 are precisely formed on the side walls of the polysilicon storage electrode 7.

In order to obtain a further increase in capacity of the storage capacitor, it was proposed to use the above first conventional technique in combination with the above second or third conventional techniques. Namely, in place of polysilicon, tungsten is used to form a tungsten storage electrode with tungsten side wall films in order to increase the capacity of the storage capacitor. In this case, once a tungsten film is entirely deposited on a silicon oxide inter-layer insulator before the tungsten film is defined into the storage electrode. The adhesion strength between the tungsten film and the silicon oxide film is weak, for which reason the tungsten film is likely to be peeled from the silicon oxide film while tungsten particles remain on the silicon oxide film, resulting in a low yield of the memory device.

If the silicon oxide film serving as the etching stopper is formed over the tungsten storage electrode, then a chemical reaction may be caused on an interface between the silicon oxide film and the tungsten storage electrode. If silicon in the silicon oxide film moves into the tungsten storage electrode by the chemical reaction, then a tantalum oxide capacitive insulation film is deteriorated in electric property. If such silicon oxide film etching stopper was once formed, it is required to remove this etching stopper from the top surface of the tungsten storage electrode by etching process. If the silicon oxide etching stopper film is etched, then the silicon oxide inter-layer insulator on which the tungsten storage electrodes are selectively formed is also subjected to this etching. As a result, when the silicon oxide etching stopper is etched, the silicon oxide inter-layer insulator is also etched to form recessed portions therein. The formation of the recessed portion in the silicon oxide inter-layer insulator results in a deterioration in electric property of the capacitive insulation film.

In the above circumstances, it had been required to develop a novel storage capacitor structure and a novel method of forming the same to allow a facilitated formation of the refractory metal side wall films on side walls of the refractory metal storage electrode without any problem in peeling a refractory metal film from an inter-layer insulator.

SUMMARY OF THE INVENTION

Accordingly, it is an object of the present invention to provide a novel storage capacitor structure in a semiconductor memory device, which is free from the above problems as described above.

It is a further object of the present invention to provide a novel storage capacitor structure in a semiconductor memory device, which allows increase in area of an interface between a storage electrode and a capacitive insulation film in order to secure a sufficiently large capacity of the semiconductor memory device even the occupied area of the semiconductor memory device is reduced for increase in the density of the integration of the semiconductor memory device.

It is a still further object of the present invention to provide a novel storage capacitor structure in a semiconductor memory device, which has a capacitive insulation film being reduced in thickness and having a high dielectric constant in order to secure a sufficiently large capacity of the semiconductor memory device even the occupied area of the semiconductor memory device is reduced for increase in the density of the integration of the semiconductor memory device.

It is yet a further object of the present invention to provide a novel storage capacitor structure in a semiconductor memory device, which facilitates formation of a refractory metal side wall films on side walls of a refractory metal storage electrode in order to secure a sufficiently large capacity of the semiconductor memory device even the occupied area of the semiconductor memory device is reduced for increase in the density of the integration of the semiconductor memory device.

It is a further more object of the present invention to provide a novel storage capacitor structure in a semiconductor memory device, which is free from any problem in peeling a refractory metal film from an inter-layer insulator in order to secure a sufficiently large capacity of the semiconductor memory device even the occupied area of the semiconductor memory device is reduced for increase in the density of the integration of the semiconductor memory device.

It is moreover an object of the present invention to provide a novel storage capacitor structure in a semiconductor memory device, which allows a capacitive insulation film to be free from any deterioration of the electric property in order to secure a sufficiently large capacity of the semiconductor memory device even the occupied area of the semiconductor memory device is reduced for increase in the density of the integration of the semiconductor memory device.

It is another object of the present invention to provide a novel method of forming a storage capacitor in a semiconductor memory device, which is free from the above problems as described above.

It is still another object of the present invention to provide a novel method of forming a storage capacitor in a semiconductor memory device, which has a sufficiently large capacity of the semiconductor memory device even the occupied area of the semiconductor memory device is reduced for increase in the density of the integration of the semiconductor memory device.

It is yet another object of the present invention to provide a novel method of forming a storage capacitor in a semiconductor memory device, which is free from any problem with reduction in the yield of the semiconductor memory device.

It is further another object of the present invention to provide a novel method of forming a storage capacitor in a semiconductor memory device, which is free from any problem in peeling a refractory metal film from an inter-layer insulator in order to secure a sufficiently large capacity of the semiconductor memory device even the occupied area of the semiconductor memory device is reduced for increase in the density of the integration of the semiconductor memory device.

It is an additional object of the present invention to provide a novel method of forming a storage capacitor in a semiconductor memory device, which has a capacitive insulation film being reduced in thickness and having a high dielectric constant in order to secure a sufficiently large capacity of the semiconductor memory device even the occupied area of the semiconductor memory device is reduced for increase in the density of the integration of the semiconductor memory device.

It is a still additional object of the present invention to provide a novel method of forming a storage capacitor in a semiconductor memory device, which suppresses any chemical reaction between a storage electrode and an etch-back stopper film.

It is yet additional object of the present invention to provide a novel method of forming a storage capacitor in a semiconductor memory device, which is free from any deterioration in electric property.

It is still more object of the present invention to provide a novel method of forming a storage capacitor in a semiconductor memory device, which allows a capacitive insulation film to be free from any deterioration of the electric property.

The above and other objects, features and advantages of the present invention will be apparent from the following descriptions.

The present invention provides a storage electrode structure of a storage capacitor in a semiconductor memory device. The storage electrode structure comprises the following elements. A barrier metal layer is provided which is made of a first metal. A storage electrode body is provided on the barrier metal layer except for a peripheral region thereof. The storage electrode body is made of a second metal having both a higher etching rate to the first metal and a high adhesion to the first metal. Side wall electrode films are provided in contact with side walls of the storage electrode body and over the peripheral region of the barrier metal layer. The side wall electrode films are made of a third metal having both a higher etching rate to the first metal and high adhesions to the first and second metals.

The present invention also provides a method of forming a storage electrode on an insulation layer. The method comprises the following steps. A barrier metal layer is formed on an entire surface of the insulation layer. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. An etch back stopper film is formed on an entire surface of the storage electrode film. The etch back stopper film has both a lower etching rate to the second metal and a high adhesion to the second metal. A photo-resist pattern is formed by photo-lithography on the etch back stopper film. The etch back stopper film and the storage electrode film are subjected to a dry etching by use of the photo-resist pattern as a mask to selectively remove the etch back stopper film and the storage electrode film and define a storage electrode body, but leave the barrier metal layer over the entire surface of the insulation film. A side wall electrode film is entirely formed, which extends over the etch back stopper film and on side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body whereby the etch back stopper film and a top surface of the barrier metal layer are shown except under both the storage electrode body and the side wall electrode films so that the side wall electrode films remain only on the side walls of the storage electrode body. The etch back stopper film and the barrier metal layer except under both the storage electrode body and the side wall electrode films are selectively removed whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer.

The present invention also provides a method of forming a storage electrode on an insulation layer. The method comprises the following steps. A barrier metal layer is formed on an entire surface of the insulation layer. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. A photo-resist pattern is formed by photo-lithography on the storage electrode film. The storage electrode film is subjected to a dry etching by use of the photo-resist pattern as a mask to selectively remove the storage electrode film and define a storage electrode body, but leave the barrier metal layer over the entire surface of the insulation film. A side wall electrode film is entirely formed, which extends on a top surface and side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body so that the side wall electrode films remain only on the side walls of the storage electrode body. The barrier metal layer is selectively removed except under both the storage electrode body and the side wall electrode films, whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer.

BRIEF DESCRIPTIONS OF THE DRAWINGS

Preferred embodiments of the present invention will be described in detail with reference to the accompanying drawing.

FIG 1. is a cross sectional elevation view illustrative of the conventional storage capacitor in the semiconductor memory device wherein a capacitive insulation film is made of tantalum oxide having a high dielectric constant and a storage electrode is made of tungsten having a resistivity to oxidation.

Figure 1:
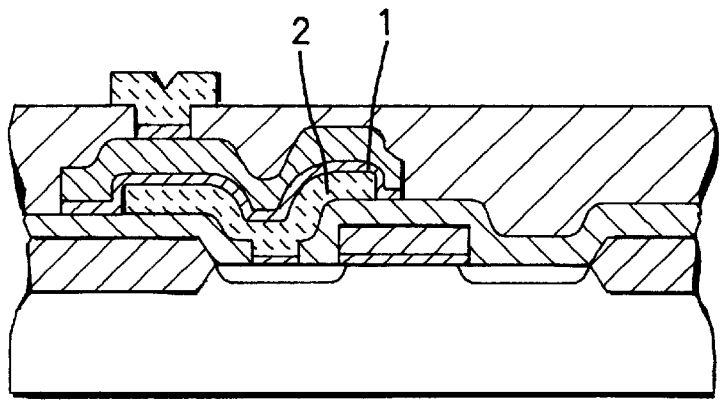
Figure 2:
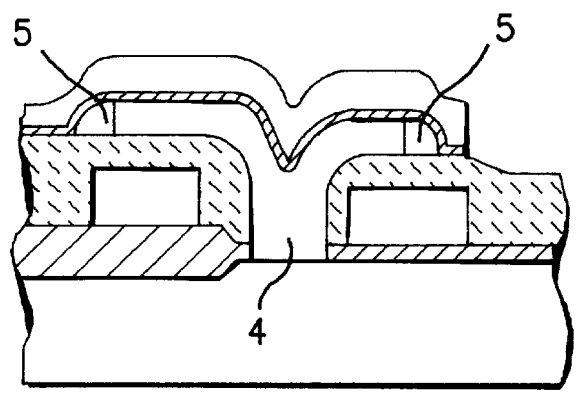
FIG. 2 is a cross sectional elevation view illustrative of the conventional storage capacitor in the semiconductor memory device wherein a capacitive insulation film is made of polysilicon and a storage electrode is made of silicon oxide and provided on its side walls with polysilicon side wall films.
Figure 3:
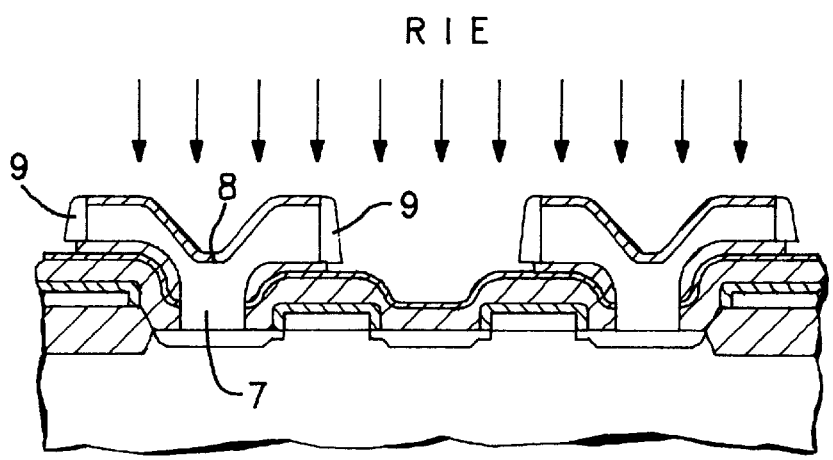
FIG. 3 is a cross sectional elevation view illustrative of the conventional storage capacitor in the semiconductor memory device wherein a capacitive insulation film is made of polysilicon and a storage electrode is made of silicon oxide and provided on its side walls with polysilicon side wall films.
Figure 4:
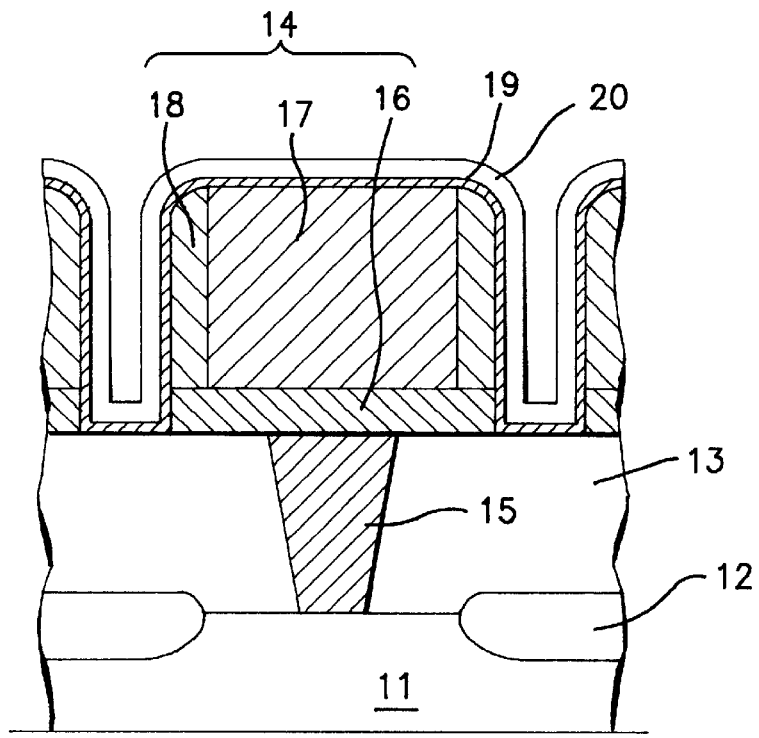

FIG. 4 is a fragmentary cross sectional elevation view illustrative of a novel storage capacitor in a semiconductor memory device wherein a capacitive insulation film is made of tantalum oxide having a high dielectric constant and a storage electrode is made of tungsten having a resistivity to oxidation and also provided on its side walls with tungsten side wall films in a preferred embodiment according to the present invention.

FIGS. 5A through 5F are fragmentary cross sectional elevation views illustrative of a novel storage capacitor in a semiconductor memory device in sequential steps involved in a novel fabricating method a preferred embodiment according to the present invention.

DISCLOSURE OF THE INVENTION

The first present invention provides a storage electrode structure of a storage capacitor in a semiconductor memory device. The storage electrode structure comprises the following elements. A barrier metal layer is provided which is made of a first metal. A storage electrode body is provided on the barrier metal layer except for a peripheral region thereof. The storage electrode body is made of a second metal having both a higher etching rate to the first metal and a high adhesion to the first metal. Side wall electrode films are provided in contact with side walls of the storage electrode body and over the peripheral region of the barrier metal layer. The side wall electrode films are made of a third metal having both a higher etching rate to the first metal and high adhesions to the first and second metals.

It is possible that the second and third metals are the same as each other.

It is preferable that the second metal is one selected from the group consisting of tungsten and tungsten nitride.

It is also preferable that the third metal is one selected from the group consisting of tungsten and tungsten nitride.

It is also preferable that the second metal is one selected from the group consisting of molybdenum and molybdenum nitride.

It is also preferable that the third metal is one selected from the group consisting of molybdenum and molybdenum nitride.

It is also preferable that at least one of the second and third metals is platinum.

It is also preferable that the second metal is one selected from the group consisting of ruthenium and ruthenium dioxide.

It is also preferable that the third metal is one selected from the group consisting of ruthenium and ruthenium dioxide.

It is also preferable that the first metal is titanium nitride.

The second present invention provides a storage capacitor formed on a silicon oxide layer. The storage capacitor comprises the following elements. A storage electrode is selectively formed on the silicon oxide layer. A capacitive insulation film extends on a top surface and side walls of the storage electrode as well as over the silicon oxide layer except under the storage electrode. The capacitive insulation film has a high dielectric constant. An opposite electrode is formed on the capacitive insulation film. The opposite electrode facing through the capacitive insulation film to the storage electrode. The storage electrode further comprises the following elements. A barrier metal layer formed on the silicon oxide film. The barrier metal layer is made of a first metal having a high adhesion to the silicon oxide film. A storage electrode body is provided on the barrier metal layer except for a peripheral region thereof. The storage electrode body is made of a second metal having both a higher etching rate to the first metal and a high adhesion to the first metal. Side wall electrode films are provided in contact with side walls of the storage electrode body and over the peripheral region of the barrier metal layer. The side wall electrode films are made of a third metal having both a higher etching rate to the first metal and high adhesions to the first and second metals.

It is possible that the second and third metals are the same as each other.

It is preferable that the second metal is one selected from the group consisting of tungsten and tungsten nitride.

It is also preferable that the third metal is one selected from the group consisting of tungsten and tungsten nitride.

It is also preferable that the second metal is one selected from the group consisting of molybdenum and molybdenum nitride.

It is also preferable that the third metal is one selected from the group consisting of molybdenum and molybdenum nitride.

It is also preferable that at least one of the second and third metals is platinum.

It is also preferable that the second metal is one selected from the group consisting of ruthenium and ruthenium dioxide.

It is also preferable that the third metal is one selected from the group consisting of ruthenium and ruthenium dioxide.

It is also preferable that the first metal is titanium nitride.

It is also preferable that the capacitive insulation film comprises a tantalum oxide film.

It is also preferable that the capacitive insulation film comprises a BST film.

It is also preferable that the capacitive insulation film comprises a PZT film.

The third present invention provides a semiconductor memory device formed on a semiconductor substrate. Filed oxide films are selectively formed on the semiconductor substrate. A silicon oxide inter-layer insulator extends over the semiconductor substrate and the filed oxide films. A contact plug is formed within a contact hole formed in the silicon oxide inter-layer insulator except over the filed oxide films. A storage electrode is selectively formed, which extends over the silicon oxide layer and the contact plug to electrically connect the storage electrode via the contact plug to the semiconductor substrate. A capacitive insulation film extends on a top surface and side walls of the storage electrode as well as over the silicon oxide inter-layer insulator except under the storage electrode. The capacitive insulation film has a high dielectric constant. An opposite electrode is formed on the capacitive insulation film. The opposite electrode faces through the capacitive insulation film to the storage electrode. The storage electrode further comprises the following elements. A barrier metal layer extends over the silicon oxide layer and the contact plug to electrically connect the storage electrode via the contact plug to the semiconductor substrate. The barrier metal layer is made of a first metal having a high adhesion to the silicon oxide film. A storage electrode body is provided on the barrier metal layer except for a peripheral region thereof. The storage electrode body is made of a second metal having both a higher etching rate to the first metal and a high adhesion to the first metal. Side wall electrode films are provided in contact with side walls of the storage electrode body and over the peripheral region of the barrier metal layer. The side wall electrode films are made of a third metal having both a higher etching rate to the first metal and high adhesions to the first and second metals.

It is possible that the second and third metals are the same as each other.

It is preferable that the second metal is one selected from the group consisting of tungsten and tungsten nitride.

It is also preferable that the third metal is one selected from the group consisting of tungsten and tungsten nitride.

It is also preferable that the second metal is one selected from the group consisting of molybdenum and molybdenum nitride.

It is also preferable that the third metal is one selected from the group consisting of molybdenum and molybdenum nitride.

It is also preferable that at least one of the second and third metals is platinum.

It is also preferable that the second metal is one selected from the group consisting of ruthenium and ruthenium dioxide.

It is also preferable that the third metal is one selected from the group consisting of ruthenium and ruthenium dioxide.

It is also preferable that the first metal is titanium nitride.

It is also preferable that the capacitive insulation film comprises a tantalum oxide film.

It is also preferable that the capacitive insulation film comprises a BST film.

It is also preferable that the capacitive insulation film comprises a PZT film.

It is also preferable that the contact plug is made of polysilicon.

The fourth present invention provides a semiconductor memory device formed on a semiconductor substrate. Filed oxide films are selectively formed on the semiconductor substrate. A silicon oxide inter-layer insulator extends over the semiconductor substrate and the filed oxide films. The silicon oxide inter-layer insulator has a contact hole except over the filed oxide films. A storage electrode is selectively formed, which extends over the silicon oxide layer and within the contact hole to electrically connect the storage electrode with the semiconductor substrate. A capacitive insulation film extends on a top surface and side walls of the storage electrode as well as over the silicon oxide inter-layer insulator except under the storage electrode. The capacitive insulation film has a high dielectric constant. An opposite electrode is formed on the capacitive insulation film, the opposite electrode facing through the capacitive insulation film to the storage electrode. The storage electrode further comprises the following elements. A barrier metal layer extends over the silicon oxide layer and within the contact hole to electrically connect the storage electrode with the semiconductor substrate. The barrier metal layer is made of a first metal having a high adhesion to the silicon oxide film. A storage electrode body is provided on the barrier metal layer except for a peripheral region thereof The storage electrode body is made of a second metal having both a higher etching rate to the first metal and a high adhesion to the first metal. Side wall electrode films are provided in contact with side walls of the storage electrode body and over the peripheral region of the barrier metal layer. The side wall electrode films are made of a third metal having both a higher etching rate to the first metal and high adhesions to the first and second metals.

It is possible that the second and third metals are the same as each other.

It is preferable that the second metal is one selected from the group consisting of tungsten and tungsten nitride.

It is also preferable that the third metal is one selected from the group consisting of tungsten and tungsten nitride.

It is also preferable that the second metal is one selected from the group consisting of molybdenum and molybdenum nitride.

It is also preferable that the third metal is one selected from the group consisting of molybdenum and molybdenum nitride.

It is also preferable that at least one of the second and third metals is platinum.

It is also preferable that the second metal is one selected from the group consisting of ruthenium and ruthenium dioxide.

It is also preferable that the third metal is one selected from the group consisting of ruthenium and ruthenium dioxide.

It is also preferable that the first metal is titanium nitride.

It is also preferable that the capacitive insulation film comprises a tantalum oxide film.

It is also preferable that the capacitive insulation film comprises a BST film.

It is also preferable that the capacitive insulation film comprises a PZT film.

The fifth present invention provides a method of forming a storage electrode on an insulation layer. The method comprises the following steps. A barrier metal layer is formed on an entire surface of the insulation layer. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. An etch back stopper film is formed on an entire surface of the storage electrode film. The etch back stopper film has both a lower etching rate to the second metal and a high adhesion to the second metal. A photo-resist pattern is formed by photo-lithography on the etch back stopper film. The etch back stopper film and the storage electrode film are subjected to a dry etching by use of the photo-resist pattern as a mask to selectively remove the etch back stopper film and the storage electrode film and define a storage electrode body, but leave the barrier metal layer over the entire surface of the insulation film. A side wall electrode film is entirely formed, which extends over the etch back stopper film and on side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body whereby the etch back stopper film and a top surface of the barrier metal layer are shown except under both the storage electrode body and the side wall electrode films so that the side wall electrode films remain only on the side walls of the storage electrode body. The etch back stopper film and the barrier metal layer except under both the storage electrode body and the side wall electrode films are selectively removed whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer.

It is possible that the second and third metals are the same as each other.

It is preferable that the second metal is one selected from the group consisting of tungsten and tungsten nitride.

It is also preferable that the third metal is one selected from the group consisting of tungsten and tungsten nitride.

It is also preferable that the second metal is one selected from the group consisting of molybdenum and molybdenum nitride.

It is also preferable that the third metal is one selected from the group consisting of molybdenum and molybdenum nitride.

It is also preferable that at least one of the second and third metals is platinum.

It is also preferable that the second metal is one selected from the group consisting of ruthenium and ruthenium dioxide.

It is also preferable that the third metal is one selected from the group consisting of ruthenium and ruthenium dioxide.

It is also preferable that the first metal is titanium nitride.

It is also preferable that the etch back stopper film is made of the same material as the barrier metal layer. In this case, it is also preferable that wherein the etch back stopper film has a thickness equal to or larger than a thickness of the barrier metal layer.

It is also preferable that the etch back stopper film and the barrier metal layer are etched by use of $Cl_2$ gas.

It is also preferable that the insulation layer comprises a silicon oxide inter-layer insulator.

The sixth present invention provides a method of forming a storage electrode on an insulation layer. The method comprises the following steps. A barrier metal layer is formed on an entire surface of the insulation layer. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. A photo-resist pattern is formed by photo-lithography on the storage electrode film. The storage electrode film is subjected to a dry etching by use of the photo-resist pattern as a mask to selectively remove the storage electrode film and define a storage electrode body, but leave the barrier metal layer over the entire surface of the insulation film. A side wall electrode film is entirely formed, which extends on a top surface and side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body so that the side wall electrode films remain only on the side walls of the storage electrode body. The barrier metal layer is selectively removed except under both the storage electrode body and the side wall electrode films, whereby a storage electrode is formed which comprises the barrier metal layer, the storage electrode body extending over the barrier metal layer except on a peripheral region thereof and the side wall electrode films in contact with side walls of the storage electrode body and over the peripheral region of the barrier metal layer It is possible that the second and third metals are the same as each other.

It is preferable that the second metal is one selected from the group consisting of tungsten and tungsten nitride.

It is also preferable that the third metal is one selected from the group consisting of tungsten and tungsten nitride.

It is also preferable that the second metal is one selected from the group consisting of molybdenum and molybdenum nitride.

It is also preferable that the third metal is one selected from the group consisting of molybdenum and molybdenum nitride.

It is also preferable that at least one of the second and third metals is platinum.

It is also preferable that the second metal is one selected from the group consisting of ruthenium and ruthenium dioxide.

It is also preferable that the third metal is one selected from the group consisting of ruthenium and ruthenium dioxide.

It is also preferable that the first metal is titanium nitride.

It is also preferable that the insulation layer comprises a silicon oxide inter-layer insulator.

The seventh present invention provides a method of forming a semiconductor memory device. The method comprises the following steps. Field oxide films are selectively formed on a semiconductor substrate. A silicon oxide inter-layer insulator is armed over the field oxide films and the semiconductor substrate. A contact hole is formed in the silicon oxide inter-layer insulator over the semiconductor substrate to have a top surface of the semiconductor substrate shown through the contact hole. The contact hole is buried with polysilicon to form a polysilicon contact plug within the contact hole. A barrier metal layer is formed over the silicon oxide inter-layer insulator and the polysilicon contact plug. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. An etch back stopper film is formed on an entire surface of the storage electrode film. The etch back stopper film has both a lower etching rate to the second metal and a high adhesion to the second metal. A photo-resist pattern is formed by photo-lithography on the etch back stopper film. The etch back stopper film and the storage electrode film are subjected to a dry etching by use of the photo-resist pattern as a mask to selectively remove the etch back stopper film and the storage electrode film and define a storage electrode body, but leave the barrier metal layer over the entire surface of the insulation film. A side wall electrode film is entirely formed, which extends over the etch back stopper film and on side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body whereby the etch back stopper film and a top surface of the barrier metal layer are shown except under both the storage electrode body and the side wall electrode films so that the side wall electrode films remain only on the side walls of the storage electrode body. The etch back stopper film and the barrier metal layer are selectively removed except under both the storage electrode body and the side wall electrode films, whereby a storage electrode is formed which comprises the barrier metal layer, the storage electrode body extending over the barrier metal layer except on a peripheral region thereof and the side wall electrode films in contact with the side walls of the storage electrode body arid over the peripheral region of the barrier metal layer. A capacitive insulation film is formed which extends on a top surface and side walls of the storage electrode as well as over the silicon oxide inter-layer insulator except under the storage electrode, the capacitive insulation film having a high dielectric constant. An opposite electrode is formed on the capacitive insulation film to have the opposite electrode face through the capacitive insulation film to the storage electrode.

It is possible that the second and third metals are the same as each other.

It is preferable that the second and third metals are one selected from the group consisting of tungsten and tungsten nitride.

It is also preferable that the second and third metals are one selected from the group consisting of molybdenum and molybdenum nitride.

It is also preferable that the second and third metals are platinum.

It is also preferable that the second and third metals are one selected from the group consisting of ruthenium and ruthenium dioxide.

It is also preferable that the first metal is titanium nitride.

It is also preferable that the etch back stopper film is made of the same material as the barrier metal layer. In this case, it is also preferable that the etch back stopper film has a thickness equal to or larger than a thickness of the barrier metal layer.

It is also preferable that the etch back stopper film and the barrier metal layer are etched by use of $Cl_2$ gas.

The eighth present invention provides a method of forming a semiconductor memory device. The method comprises the following steps. Field oxide films are selectively formed on a semiconductor substrate. A silicon oxide inter-layer insulator is formed over the field oxide films and the semiconductor substrate. A contact hole is formed in the silicon oxide interlayer insulator over the semiconductor substrate to have a top surface of the semiconductor substrate shown through the contact bole. A barrier metal layer is formed not only over the silicon oxide inter-layer insulator but also within the contact hole. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. An etch back stopper film is formed on an entire surface of the storage electrode film. The etch back stopper film has both a lower etching rate to the second metal and a high adhesion to the second metal. A photo-resist pattern is formed by photo-lithography on the etch back stopper film. The etch back stopper film and the storage electrode film are subjected to a dry etching by use of the photo-resist pattern as a mask to selectively remove the etch back stopper film and the storage electrode film and define a storage electrode body, but leave the barrier metal layer over the entire surface of the insulation film. A side wall electrode film is entirely formed, which extends over the etch back stopper film and on side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body whereby the etch back stopper film and a top surface of the barrier metal layer are shown except under both the storage electrode body and the side wall electrode films so that the side wall electrode films remain only on the side walls of the storage electrode body. The etch back stopper film and the barrier metal layer except under both the storage electrode body and the side wall electrode films are selectively removed, whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer. A capacitive insulation film is formed which extends on a top surface and side walls of the storage electrode as well as over the silicon oxide inter-layer insulator except under the storage electrode. The capacitive insulation film has a high dielectric constant. An opposite electrode is formed on the capacitive insulation film to have the opposite electrode ice through the capacitive insulation film to the storage electrode.

It is possible that the second and third metals are the same as each other.

It is preferable that the second and third metals are one selected from the group consisting of tungsten and tungsten nitride.

It is also preferable that the second and third metals are one selected from the group consisting of molybdenum and molybdenum nitride.

It is also preferable that the second and third metals are platinum.

It is also preferable that the second and third metals are one selected from the group consisting of ruthenium and ruthenium dioxide.

It is also preferable that the first metal is titanium nitride.

It is also preferable that the etch back stopper film is made of the same material as the barrier metal layer. In this case, it is also preferable that the etch back stopper film has a thickness equal to or larger than a thickness of the barrier metal layer.

It is also preferable that the etch back stopper film and the barrier metal layer are etched by use of $Cl_2$ gas.

The ninth present invention provides a method of forming a semiconductor memory device. The method comprises the following steps. Field oxide films are selectively formed on a semiconductor substrate. A silicon oxide inter-layer insulator is formed over the field oxide films and the semiconductor substrate. A contact hole is formed in the silicon oxide inter-layer insulator over the semiconductor substrate to have a top surface of the semiconductor substrate shown through the contact hole. The contact hole is buried with polysilicon to form a polysilicon contact plug within the contact hole. A barrier metal layer is formed over the silicon oxide inter-layer insulator and the polysilicon contact plug. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. A photo-resist pattern is formed by photo-lithography on the storage electrode film. The storage electrode film is subjected to a dry etching by use of the photo-resist pattern as a mask to selectively remove the storage electrode film and define a storage electrode body, but leave the barrier metal layer over the entire surface of the insulation film. A side wall electrode film is entirely formed, which extends on a top surface and side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body whereby both a top surface of the storage electrode body and a top surface of the barrier metal layer are shown except under both the storage electrode body and the side wall electrode films so that the side wall electrode films remain only on the side walls of the storage electrode body. The barrier metal layer is selectively removed except under both the storage electrode body and the side wall electrode films, whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer. A capacitive insulation film is formed which extends on a top surface and side walls of the storage electrode as well as over the silicon oxide inter-layer insulator except under the storage electrode. The capacitive insulation film has a high dielectric constant. An opposite electrode is formed on the capacitive insulation film to have the opposite electrode face through the capacitive insulation film to the storage electrode.

It is possible that the second and third metals are the same as each other.

It is preferable that the second and third metals are one selected from the group consisting of tungsten and tungsten nitride.

It is also preferable that the second and third metals are one selected from the group consisting of molybdenum and molybdenum nitride.

It is also preferable that the second and third metals are platinum.

It is also preferable that the second and third metals are one selected from the group consisting of ruthenium and ruthenium dioxide.

It is also preferable that the first metal is titanium nitride.

The tenth present invention provides a method of forming a semiconductor memory device. The method comprises the following steps. Field oxide films are selectively formed on a semiconductor substrate. A silicon oxide inter-layer insulator is formed over the field oxide films and the semiconductor substrate. A contact hole is formed in the silicon oxide inter-layer insulator over the semiconductor substrate to have a top surface of the semiconductor substrate shown through the contact hole. A barrier metal layer is formed not only over the silicon oxide inter-layer insulator but also within the contact hole. The barrier metal layer is made of a first metal having a high adhesion to the insulation layer. A storage electrode film is formed on an entire surface of the barrier metal layer. The storage electrode film is made of a second metal having both a higher etching rate to the first metal and a high adhesion to the first metal. A photo-resist pattern is formed by photo-lithography on the storage electrode film. The storage electrode film is subjected to a dry etching by use of the photo-resist pattern as a mask to selectively remove the storage electrode film and define a storage electrode body, but leave the barrier metal layer over the entire surface of the insulation film. A side wall electrode film is entirely formed, which extends on a top surface and side walls of the storage electrode body as well as over the barrier metal layer except under the storage electrode body. The side wall electrode film is made of a third metal having both a higher etching rate to the first metal and high adhesions to the first and second metals. The side wall electrode film is subjected to an etch back to selectively remove the side wall electrode film except on the side walls of the storage electrode body whereby both a top surface of the storage electrode body and a top surface of the barrier metal layer are shown except under both the storage electrode body and the side wall electrode films so that the side wall electrode films remain only on the side walls of the storage electrode body. The barrier metal layer is selectively removed except under both the storage electrode body and the side wall electrode films, whereby a storage electrode is formed which comprises the barrier metal layer, the storage electrode body extending over the barrier metal layer except on a peripheral region thereof and the side wall electrode films in contact with the side walls of the storage electrode body and over the peripheral region of the barrier metal layer. A capacitive insulation film is formed which extends on a top surface and side walls of the storage electrode as well as over the silicon oxide inter-layer insulator except under the storage electrode. The capacitive insulation film has a high dielectric constant. An opposite electrode is formed on the capacitive insulation film to have the opposite electrode face through the capacitive insulation film to the storage electrode.

It is possible that the second and third metals are the same as each other.

It is preferable that the second and third metals are one selected from the group consisting of tungsten and tungsten nitride.

It is also preferable that the second and third metals are one selected from the group consisting of molybdenum and molybdenum nitride.

It is also preferable that the second and third metals are platinum.

It is also preferable that the second and third metals are one selected from the group consisting of ruthenium and ruthenium dioxide.

It is also preferable that the first metal is titanium nitride.

PREFERRED EMBODIMENT

A first embodiment according to the present invention will be described, which provides a novel storage capacitor in a semiconductor memory device, wherein a capacitive insulation film is made of tantalum oxide having a high dielectric constant and a storage electrode is made of tungsten having a resistivity to oxidation and also provided on its side walls with tungsten side wall films in a preferred embodiment according to the present invention.

A structure of the novel storage capacitor in a semiconductor memory device is illustrated in FIG. 4. Field oxide films 12 are selectively formed on a top surface of a p-type silicon substrate 11. An inter-layer insulator 13 is entirely formed over the p-type silicon substrate 11 and the field oxide film 12. A contact hole is formed in the inter-layer insulator 13 except its positions over the field oxide film 12 so that the contact hole reaches the top surface of the p-type silicon substrate 11. The inter-layer insulator 13 may comprise a silicon oxide film. A contact plug 15 is formed within the contact hole so that the bottom of the contact plug 15 is in contact with the top surface of the p-type silicon substrate 11. The contact plug 15 may be made of an electrically conductive material such as polysilicon. A barrier metal film 16 is selectively formed which extends over the top surfaces of the contact plug 15 and the inter-layer insulator 13. The barrier metal film 16 is electrically connected through the contact plug 15 to the p-type silicon substrate 11. The barrier metal film 16 is made of a barrier metal such as titanium nitride. A tungsten storage electrode body 17 is formed which extends over the titanium nitride barrier metal film 16. Further, side wall tungsten films 18 are formed in contact with side walls of the tungsten storage electrode body 17, wherein the side wall tungsten films 18 extend over edge portions of the titanium nitride barrier metal film 16. The tungsten storage electrode body 17 united with the side wall tungsten films 18 extend over the titanium nitride barrier metal film 16. In short, the tungsten storage electrode body 17 united with the side wall tungsten films 18 are separated by the titanium nitride barrier metal film 16 from the silicon oxide inter-layer insulator 13. A storage electrode 14 comprises the tungsten storage electrode body 17, the side wall tungsten films 18 and the titanium nitride barrier metal film 16. The edges of the side wall tungsten films 18 are aligned to the edges of the titanium nitride barrier metal film 16 so that the storage electrode 14 has straight vertical side walls without any step. A capacitive insulation film 19 made of tantalum oxide having a high dielectric constant is formed which cover the storage electrode 14 and also cover the silicon oxide inter-layer insulator 13. In detail, the tantalum oxide capacitive insulation film 19 extends over the silicon oxide inter-layer insulator 13 except under the storage electrode 14 and also extends on the vertical straight side walls and the top surface of the storage electrode 14. An opposite electrode 20 made of titanium nitride is formed on entire parts of the tantalum oxide capacitive insulation film 19 so that the titanium nitride opposite electrode 20 faces via the tantalum oxide capacitive insulation film 19 to the vertical straight side walls and the top portion of the storage electrode 14 which comprises the titanium nitride barrier metal film 16, the tungsten storage electrode body 17 and the side wall tungsten films 18.

Subsequently, a novel method of forming the above storage capacitor in the semiconductor memory device will be described with reference to FIGS. 5A through 5F.

Figure 5A:
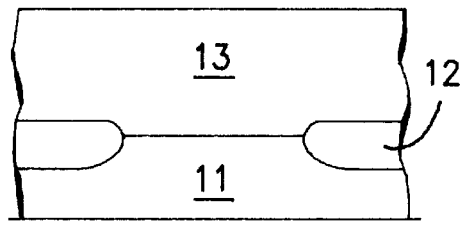

With reference to FIG. 5A, field oxide films 12 are selectively formed on a top surface of a p-type silicon substrate 11. An inter-layer insulator 13 is entirely formed over the p-type silicon substrate 11 and the field oxide film 12.

Figure 5B:
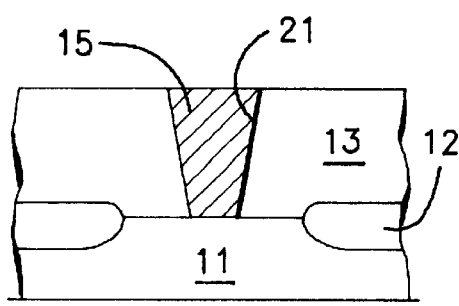

With reference to FIG. 5B, a contact hole 21 is formed in the inter-layer insulator 13 except over the field oxide film 12 so that the contact hole 21 reaches the top surface of the p-type silicon substrate 11. Namely, the top surface of the p-type silicon substrate 11 is shown through the contact hole 21. The inter-layer insulator 13 may comprise a silicon oxide film. A contact plug 15 is formed within the contact hole 21 so that the bottom of the contact plug 15 is in contact with the top surface of the p-type silicon substrate 11. The contact plug 15 may be made of an electrically conductive material such as polysilicon.

Figure 5C:
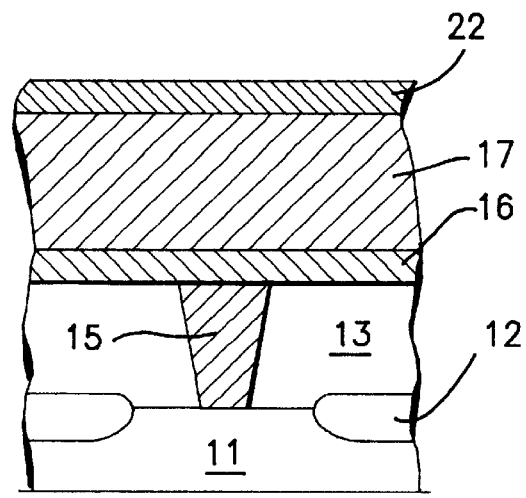

With reference to FIG. 5C, a barrier metal film 16 having a thickness of 100 nanometers is entirely formed which extends over the top surfaces of the polysilicon contact plug 15 and the silicon oxide inter-layer insulator 13. The barrier metal film 16 is electrically connected through the contact plug 15 to the p-type silicon substrate 11. The barrier metal film 16 is made of a barrier metal such as titanium nitride. A tungsten storage electrode film 17 having a thickness of 5000 nanometers is entirely formed over the titanium nitride barrier metal film 16. The titanium nitride barrier metal film 16 plays the following important rolls. An adhesion between a tungsten film and a silicon oxide film is weak, for which reason if, contrary to the present invention, the tungsten storage electrode film 17 were directly formed on the silicon oxide inter-layer insulator 13, then the tungsten storage electrode film 17 is likely to be peeled from the surface of the silicon oxide inter-layer insulator 13. By contrast, an adhesion between a barrier metal film such as a titanium nitride film and a silicon oxide film is relatively strong and also an adhesion between the barrier metal film and the tungsten film is sufficiently strong, for which reason if the titanium nitride barrier metal layer 16 is provided to be sandwiched between the silicon oxide inter-layer insulator 13 and the tungsten storage electrode film 17, then the silicon oxide inter-layer insulator 13 is securely adhered with the titanium nitride barrier metal layer 16 and further the tungsten storage electrode film 17 is also adhered securely with the titanium nitride barrier metal layer 16. Namely, the tungsten storage electrode film 17 is adhered securely through the titanium nitride barrier metal layer 16 to the silicon oxide inter-layer insulator 13. It is, therefore, unlikely that the tungsten storage electrode film 17 is peeled and tungsten particles are generated. If, contrary to the prevent invention, the tungsten storage electrode film 17 is directly formed on the polysilicon contact plug 15, then an excessive reaction between tungsten and polysilicon may be caused whereby the electric property is deteriorated. If, however, in accordance with the present invention, the titanium nitride barrier metal layer 16 is provided to be sandwiched between the tungsten storage electrode film 17 and the polysilicon contact plug 15, then the titanium nitride barrier metal layer 16 prevents such excessive reaction between tungsten and polysilicon. Further, a titanium nitride etch back stopper film 22 having a thickness of 100 nanometers is entirely formed over the tungsten storage electrode film 17. The thickness of the titanium nitride etch back stopper film 22 is equal to that of the titanium nitride barrier metal layer 16. It is important that the etch back stopper film 22 is made of titanium nitride but not silicon oxide. If, contrary to the present invention, the etch back stopper film is made of silicon oxide, then it is likely that a reaction of tungsten with silicon might be caused on the interface between the tungsten storage electrode film 17 and the etch back stopper film and also likely that silicon in the etch back stopper film is diffused into the tungsten storage electrode film 17 whereby a tantalum oxide capacitive insulation film to be provided on the tungsten storage electrode film 17 is deteriorated in electric property. If, however, in accordance with the present invention, the etch back stopper film 22 is made of titanium nitride, then it is possible to prevent a reaction of silicon from on the interface between the tungsten storage electrode film 17 and the etch back stopper film and also possible to prevent any diffusion of silicon in the etch back stopper film into the tungsten storage electrode film 17. It is therefore possible to prevent any drop of the yield.

With reference to FIG. 5D, a photo-resist film is applied on the titanium nitride etch back stopper film 22 and then patterned by a photo-lithography to form a photo-resist pattern on the titanium nitride etch back stopper film 22. The titanium nitride etch back stopper film 22 and the tungsten storage electrode film 17 are selectively etched by a dry etching process using the photo-resist pattern as a mask. As a result, the tungsten storage electrode body 17 is defined. In accordance with the present invention, the titanium nitride barrier metal layer 16 is never etched. Notwithstanding, there is no problem even if the titanium nitride barrier metal layer 16 is slightly etched. In the light of increasing the density of the integration of the memory device, it is preferable to minimize a distance between adjacent two of the tungsten storage electrode bodies 17. This minimum distance between adjacent two of the tungsten storage electrode bodies 17 is defined by a minimum processing size of a photo-lithography system.

With reference to FIG. 5E, a tungsten film is entirely deposited whereby the tungsten film extends on the titanium nitride barrier metal layer 16 except under the tungsten storage electrode body 17 and further extends on the side walls of the tungsten storage electrode body 17 as well as over the top surface of the titanium nitride etch back stopper film 22. The titanium nitride barrier metal film 16 plays the following important rolls. An adhesion between a tungsten film and a silicon oxide film is weak, for which reason if, contrary to the present invention, the titanium nitride barrier metal layer 16 is selectively removed except under the tungsten storage electrode body 17 and further if the tungsten film were directly formed on the silicon oxide inter-layer insulator 13, then the tungsten film is likely to be peeled from the surface of the silicon oxide inter-layer insulator 13. By contrast, an adhesion between a barrier metal film such as a titanium nitride film and a silicon oxide film is relatively strong and also an adhesion between the barrier metal film and the tungsten film is sufficiently strong, for which reason if the titanium nitride barrier metal layer 16 is provided to be sandwiched between the silicon oxide inter-layer insulator 13 and the tungsten film, then the silicon oxide inter-layer insulator 13 is securely adhered with the titanium nitride barrier metal layer 16 and further the tungsten film is also adhered securely with the titanium nitride barrier metal layer 16. Namely, the tungsten film is adhered securely through the titanium nitride barrier metal layer 16 to the silicon oxide inter-layer insulator 13. It is, therefore, unlikely that the tungsten film is peeled and tungsten particles are generated. This can prevent the yield to be dropped.

An etch back process is carried out by use of an etching gas of $SF_6$ main component to remove the tungsten film except on the side walls of the tungsten storage electrode body 17. As a result, the tungsten side wall films 18 are formed on the side walls of the tungsten storage electrode body 17. The thickness of the tungsten film 18 is defined by the distance between adjacent two of the tungsten storage electrode bodies 17. If, for example, the distance between the adjacent two of the tungsten storage electrode bodies 17 is 300 nanometers, then the thickness of the tungsten film 18 may be about 100 nanometers. It is preferable that the etch back process is continued until the top surface of the titanium nitride etch back stopper film 22 is shown. Notwithstanding, there is no problem even if the titanium nitride etch back stopper film 22 and the titanium nitride barrier metal layer 16 except under the tungsten storage electrode body 17 are slightly etched.

With reference to FIG. 5F, a dry etching process is carried out by using a $Cl_2$ etching gas which is capable of etching titanium nitride but incapable of etching tungsten. As a result, the titanium nitride etch back stopper film 22 and the titanium nitride barrier metal layer 16, except under both the tungsten storage electrode body 17 and the tungsten side wall films 18, are etched and completely removed, whilst the tungsten storage electrode body 17 and the tungsten side wall films 18 are never etched. As a result, the silicon oxide inter-layer insulator 13 is shown except under both the tungsten storage electrode body 17 and the tungsten side wall films 18. Further, the top surface of the tungsten storage electrode body 17 is also shown. The tungsten storage electrode body 17 united with the side wall tungsten films 18 extend over the titanium nitride barrier metal film 16. In short, the tungsten storage electrode body 17 united with the side wall tungsten films 18 are separated by the titanium nitride barrier metal film 16 from the silicon oxide inter-layer insulator 13. A storage electrode 14 is then formed, which comprises the tungsten storage electrode body 17, the side wall tungsten films 18 and the titanium nitride barrier metal film 16. The edges of the side wall tungsten films 18 are aligned to the edges of the titanium nitride barrier metal film 16 so that the storage electrode 14 has straight vertical side walls without any step.

It is important that the above titanium nitride barrier metal film 16 is etched together with the titanium nitride etch back stopper film 22 and also protect the silicon oxide inter-layer insulator 13 underlying the titanium nitride barrier metal film 16 from being etched, for which reason it is possible to prevent any recessed portion from being formed in the silicon oxide inter-layer insulator 13. This allows that a capacitive insulation film free from any deterioration of electric property to be formed not only on the entire surface of the storage electrode 14 but also over the silicon oxide inter-layer insulator 13 except under the storage electrode 14.

With reference again to FIG. 4, a capacitive insulation film 19 made of tantalum oxide having a high dielectric constant is formed which covers the storage electrode 14 and also cover the silicon oxide inter-layer insulator 13. In detail, the tantalum oxide capacitive insulation film 19 extends over the silicon oxide inter-layer insulator 13 except under the storage electrode 14 and also extends on the vertical straight side walls and the top surface of the storage electrode 14. An opposite electrode 20 made of titanium nitride is formed on entire parts of the tantalum oxide capacitive insulation film 19 so that the titanium nitride opposite electrode 20 faces via the tantalum oxide capacitive insulation film 19 to the vertical straight side walls and the top portion of the storage electrode 14 which comprises the titanium nitride barrier metal film 16, the tungsten storage electrode body 17 and the side wall tungsten films 18 whereby the storage capacitor is completed.

In accordance with the above novel method of forming the storage capacitor, the titanium nitride barrier metal film 16 plays the following important rolls. An adhesion between a tungsten film and a silicon oxide film is weak, for which reason if, contrary to the present invention, the titanium nitride barrier metal layer 16 is selectively removed except under the tungsten storage electrode body 17 and further if the tungsten film were directly formed on the silicon oxide inter-layer insulator 13, then the tungsten film is likely to be peeled from the surface of the silicon oxide inter-layer insulator 13. By contrast, an adhesion between a barrier metal film such as a titanium nitride film and a silicon oxide film is relatively strong and also an adhesion between the barrier metal film and the tungsten film is sufficiently strong, for which reason if the titanium nitride barrier metal layer 16 is provided to be sandwiched between the silicon oxide inter-layer insulator 13 and the tungsten film, then the silicon oxide inter-layer insulator 13 is securely adhered with the titanium nitride barrier metal layer 16 and further the tungsten film is also adhered securely with the titanium nitride barrier metal layer 16. Namely, the tungsten film is adhered securely through the titanium nitride barrier metal layer 16 to the silicon oxide inter-layer insulator 13. It is, therefore, unlikely that the tungsten film is peeled and tungsten particles are generated. This can prevent the yield to be dropped.

It is important that the etch back stopper film 22 is made of titanium nitride but not silicon oxide. If, contrary to the present invention, the etch back stopper film is made of silicon oxide, then it is likely that a reaction of tungsten with silicon might be caused on the interface between the tungsten storage electrode film 17 and the etch back stopper film and also likely that silicon in the etch back stopper film is diffused into the tungsten storage electrode film 17 whereby a tantalum oxide capacitive insulation film to be provided on the tungsten storage electrode film 17 is deteriorated in electric property. If, however, in accordance with the present invention, the etch back stopper film 22 is made of titanium nitride, then it is possible to prevent a reaction of tungsten with silicon from on the interface between the tungsten storage electrode film 17 and the etch back stopper film and also possible to prevent any diffusion of silicon in the etch back stopper film into the tungsten storage electrode film 17. It is therefore possible to prevent any drop of the yield.

It is also important that the above tit nitride barrier metal film 16 is etched together with the titanium nitride etch back stopper film 22 and also protect the silicon oxide inter-layer insulator 13 underlying the titanium nitride barrier metal film 16 from being etched, for which reason it is possible to prevent any recessed portion from being formed in the silicon oxide inter-layer insulator 13. This allows that a capacitive insulation film free from any deterioration of electric property to be formed not only on the entire surface of the storage electrode 14 but also over the silicon oxide inter-layer insulator 13 except under the storage electrode 14.

As described above, in accordance with the present invention, there is provided the novel storage capacitor structure increasing in area of the interface between the storage electrode and the capacitive insulation film whilst reducing in thickness of a capacitive insulation film having a high dielectric constant in order to secure a sufficiently large capacity of the semiconductor memory device even the occupied area of the semiconductor memory device is reduced for increase in the density of the integration of the semiconductor memory device.

There is also provided the novel method of forming the storage capacitor which is free from any problem with reduction in the yield due to peeling the tungsten film as well as has a sufficiently large capacity of the semiconductor memory device even the occupied area of the semiconductor memory device is reduced for increase in the density of the integration of the semiconductor memory device.

As a modification, it is possible to form the titanium nitride barrier metal film 16 not only over the silicon oxide inter-layer insulator 13 but also in the contact hole 21 in place of the contact plug 15.

As a further modification, it is possible that the barrier metal film 16 comprises laminations of plural metal layers in place of a single titanium nitride layer.

As a still further modification, it is possible that the barrier metal film 16 and the etch back stopper film 22 are made of other metals acting as barrier metals against the material of the storage electrode in place of titanium nitride.

As a further more modification, it is possible that the storage electrode body 17 and the side wall films 18 are made of tungsten nitride, molybdenum, molybdenum nitride or platinum or the like, in place of tungsten.

Even in the above preferred embodiment the thickness of the etch back stopper film 22 is equal to the thickness of the barrier metal film 16, it is also possible that the thickness of the etch back stopper film 22 is larger than the thickness of the barrier metal film 16.

As yet a further modification, it is possible that the capacitive insulation film 19 is made of insulation materials having high dielectric constants, in place of tantalum oxide. If the capacitive insulation film 19 comprises a BST film, then the etch back stopper film 22 comprises a titanium nitride film and the storage electrode body 17 and the side wall films 18 are made of either ruthenium or ruthenium dioxide. If, however, the capacitive insulation film 19 comprises a PZT film, then the etch back stopper film 22 comprises a titanium nitride film and the storage electrode body 17 and the side wall films 18 are made of platinum.

Even in the above embodiment the etch back stopper film 22 is used to control the etching time, it is also possible to use other measures for controlling the etching time without use of the etch back stopper film 22.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A storage electrode structure of a storage capacitor in a semiconductor memory device, said storage electrode structure comprising:
    a barrier metal layer made of a first metal;
    a storage electrode body on a first surface of said barrier metal layer except for a peripheral region of said first surface, said storage electrode body being made of a second metal having both a higher etching rate than said first metal and a high adhesion to said first metal; and
    side wall electrode films in contact with side walls of said storage electrode body and on said peripheral region of said first surface of said barrier metal layer, said side wall electrode films being made of a third metal having both a higher etching rate than said first metal and high adhesions to said first and second metals.

2. The storage electrode structure as claimed in claim 1, wherein said second and third metals are the same as each other.

3. The storage electrode structure as claimed in claim 1, wherein said second metal is one selected from the group consisting of tungsten and tungsten nitride.

4. The storage electrode structure as claimed in claim 1, wherein said third metal is one selected from the group consisting of tungsten and tungsten nitride.

5. The storage electrode structure as claimed in claim 1, wherein said second metal is one selected from the group consisting of molybdenum and molybdenum nitride.

6. The storage electrode structure as claimed in claim 1, wherein said third metal is one selected from the group consisting of molybdenum and molybdenum nitride.

7. The storage electrode structure as claimed in claim 1, wherein at least one of said second and third metals is platinum.

8. The storage electrode structure as claimed in claim 1, wherein said second metal is one selected from the group consisting of ruthenium and ruthenium dioxide.

9. The storage electrode structure as claimed in claim 1, wherein said third metal is one selected from the group consisting of ruthenium and ruthenium dioxide.

10. The storage electrode structure as claimed in claim 1, wherein said first metal is titanium nitride.

11. A storage capacitor formed on a silicon oxide layer, said storage capacitor comprising:
    a storage electrode on said silicon oxide layer;
    a capacitive insulation film extending on a top surface and side walls of said storage electrode as well as over said silicon oxide layer except under said storage electrode, said capacitive insulation film having a high dielectric constant; and
    an opposite electrode on said capacitive insulation film, said opposite electrode facing through said capacitive insulation film to said storage electrode,
    wherein said storage electrode further comprises:
        a barrier metal layer on said silicon oxide film, said barrier metal layer being made of a first metal having a high adhesion to said silicon oxide film;
        a storage electrode body on an upper surface of said barrier metal layer except for a peripheral region of said upper surface, said storage electrode body being made of a second metal having both a higher etching rate than said first metal and a high adhesion to said first metal; and
        side wall electrode films in contact with side walls of said storage electrode body and having respective bottom surfaces on said peripheral region of said upper surface of said barrier metal layer, said side wall electrode films being made of a third metal having both a higher etching rate than said first metal and high adhesions to said first and second metals.

12. The storage capacitor as claimed in claim 11, wherein said second and third metals are the same as each other.

13. The storage capacitor as claimed in claim 11, wherein said second metal is one selected from the group consisting of tungsten and tungsten nitride.

14. The storage capacitor as claimed in claim 11, wherein said third metal is one selected from the group consisting of tungsten and tungsten nitride.

15. The storage capacitor as claimed in claim 11, wherein said second metal is one selected from the group consisting of molybdenum and molybdenum nitride.

16. The storage capacitor as claimed in claim 11, wherein said third metal is one selected from the group consisting of molybdenum and molybdenum nitride.

17. The storage capacitor as claimed in claim 11, wherein at least one of said second and third metals is platinum.

18. The storage capacitor as claimed in claim 11, wherein said second metal is one selected from the group consisting of ruthenium and ruthenium dioxide.

19. The storage capacitor as claimed in claim 11, wherein said third metal is one selected from the group consisting of ruthenium and ruthenium dioxide.

20. The storage capacitor as claimed in claim 11, wherein said first metal is titanium nitride.

21. The storage capacitor as claimed in claim 11, wherein said capacitive insulation film comprises a tantalum oxide film.

22. The storage capacitor as claimed in claim 11, wherein said capacitive insulation film comprises a BST film.

23. The storage capacitor as claimed in claim 11, wherein said capacitive insulation film comprises a PZT film.

24. A semiconductor memory device comprising:

a semiconductor substrate;

field oxide films on said semiconductor substrate;

a silicon oxide inter-layer insulator extending over said semiconductor substrate and said field oxide films;

a contact plug within a contact hole in said silicon oxide inter-layer insulator except over said field oxide films;

a storage electrode which extends over said silicon oxide layer and said contact plug to electrically connect said storage electrode via said contact plug to said semiconductor substrate;

a capacitive insulation film extending on a top surface and side walls of said storage electrode as well as over said silicon oxide inter-layer insulator except under said storage electrode, said capacitive insulation film having a high dielectric constant; and an opposite electrode on said capacitive insulation film, said opposite electrode facing through said capacitive insulation film to said storage electrode, wherein said storage electrode further comprises:

a barrier metal layer extending over said silicon oxide layer and said contact plug to electrically connect said storage electrode via said contact plug to said semiconductor substrate, said barrier metal layer being made of a first metal having a high adhesion to said silicon oxide film;

a storage electrode body on said barrier metal layer except for a peripheral region thereof, said storage electrode body being made of a second metal having both a higher etching rate than said first metal and a high adhesion to said first metal; and side wall electrode films in contact with side walls of said storage electrode body and on said peripheral region of said barrier metal layer, said side wall electrode films having external peripheral sides that are generally coplanar with external peripheral edges of said barrier metal layer, said side wall electrode films being made of a third metal having both a higher etching rate than said first metal and high adhesions to said first and second metals.

25. The semiconductor memory device as claimed in claim 24, wherein said second and third metals are the same as each other.

26. The semiconductor memory device as claimed in claim 24, wherein said second metal is one selected from the group consisting of tungsten and tungsten nitride.

27. The semiconductor memory device as claimed in claim 24, wherein said third metal is one selected from the group consisting of tungsten and tungsten nitride.

28. The semiconductor memory device as claimed in claim 24, wherein said second metal is one selected from the group consisting of molybdenum and molybdenum nitride.

29. The semiconductor memory device as claimed in claim 24, wherein said third metal is one selected from the group consisting of molybdenum and molybdenum nitride.

30. The semiconductor memory device as claimed in claim 24, wherein at least one of said second and third metals is platinum.

31. The semiconductor memory device as claimed in claim 24, wherein said second metal is one selected from the group consisting of ruthenium and ruthenium dioxide.

32. The semiconductor memory device as claimed in claim 24, wherein said third metal is one selected from the group consisting of ruthenium and ruthenium dioxide.

33. The semiconductor memory device as claimed in claim 24, wherein said first metal is titanium nitride.

34. The semiconductor memory device as claimed in claim 24, wherein said capacitive insulation film comprises a tantalum oxide film.

35. The semiconductor memory device as claimed in claim 24, wherein said capacitive insulation film comprises a BST film.

36. The semiconductor memory device as claimed in claim 24, wherein said capacitive insulation film comprises a PZT film.

37. The semiconductor memory device as claimed in claim 24, wherein said contact plug is made of polysilicon.

38. A semiconductor memory device comprising:

a semiconductor substrate;

field oxide films on said semiconductor substrate;

a silicon oxide inter-layer insulator extending over said semiconductor substrate and said field oxide films, said silicon oxide inter-layer insulator having a contact hole except over said field oxide films;

a storage electrode which extends over said silicon oxide layer and within said contact hole to electrically connect said storage electrode with said semiconductor substrate;

a capacitive insulation film on a top surface and side walls of said storage electrode as well as over said silicon oxide inter-layer insulator except under said storage electrode, said capacitive insulation film having a high dielectric constant; and an opposite electrode on said capacitive insulation film, said opposite electrode facing said storage electrode through said capacitive insulation film, wherein said storage electrode further comprises:

a barrier metal layer extending over said silicon oxide layer and within said contact hole to electrically connect said storage electrode with said semiconductor substrate, said barrier metal layer being made of a first metal having a high adhesion to said silicon oxide film;

a storage electrode body on an upper surface of said barrier metal layer except for a peripheral region of said upper surface, said storage electrode body being made of a second metal having both a higher etching rate than said first metal and a high adhesion to said first metal; and side wall electrode films in contact with side walls of said storage electrode body and having respective bottom surfaces directly on said peripheral region of said upper surface of said barrier metal layer, said side wall electrode films having external peripheral sides that are generally coplanar with external peripheral edges of said barrier metal layer, said side wall electrode films being made of a third metal having both a higher etching rate than said first metal and high adhesions to said first and second metals.

39. The semiconductor memory device as claimed in claim 38, wherein said second and third metals are the same as each other.

40. The semiconductor memory device as claimed in claim 38, wherein said second metal is one selected from the group consisting of tungsten and tungsten nitride.

41. The semiconductor memory device as claimed in claim 38, wherein said third metal is one selected from the group consisting of tungsten and tungsten nitride.

42. The semiconductor memory device as claimed in claim 38, wherein said second metal is one selected from the group consisting of molybdenum and molybdenum nitride.

43. The semiconductor memory device as claimed in claim 38, wherein said third metal is one selected from the group consisting of molybdenum and molybdenum nitride.

44. The semiconductor memory device as claimed in claim 38, wherein at least one of said second and third metals is platinum.

45. The semiconductor memory device as claimed in claim 38, wherein said second metal is one selected from the group consisting of ruthenium and ruthenium dioxide.

46. The semiconductor memory device as claimed in claim 38, wherein said third metal is one selected from the group consisting of ruthenium and ruthenium dioxide.

47. The semiconductor memory device as claimed in claim 38, wherein said first metal is titanium nitride.

48. The semiconductor memory device as claimed in claim 38, wherein said capacitive insulation film comprises a tantalum oxide film.

49. The semiconductor memory device as claimed in claim 38, wherein said capacitive insulation film comprises a BST film.

50. The semiconductor memory device as claimed in claim 38, wherein said capacitive insulation film comprises a PZT film.

* * * * *